(12) United States Patent
Morita

(10) Patent No.: US 6,727,523 B2
(45) Date of Patent: Apr. 27, 2004

(54) METHOD OF MANUFACTURING CRYSTAL OF III-V COMPOUNDS OF THE NITRIDE SYSTEM, CRYSTAL SUBSTRATE OF III-V COMPOUNDS OF THE NITRIDE SYSTEM, CRYSTAL FILM OF III-V COMPOUNDS OF THE NITRIDE SYSTEM, AND METHOD OF MANUFACTURING DEVICE

(75) Inventor: Etsuo Morita, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/290,570

(22) Filed: Nov. 8, 2002

(65) Prior Publication Data

US 2003/0073315 A1 Apr. 17, 2003

Related U.S. Application Data

(62) Division of application No. 09/739,491, filed on Dec. 18, 2000, now Pat. No. 6,498,048.

(30) Foreign Application Priority Data

Dec. 16, 1999 (JP) .......................................... P11-357325

(51) Int. Cl.[7] ............................................... H01L 31/00
(52) U.S. Cl. ....................................................... 257/103
(58) Field of Search ............................. 438/22, 24, 46, 438/47, 202, 702, 442, 479, 483

(56) References Cited

U.S. PATENT DOCUMENTS

| | | | |
|---|---|---|---|
| 4,952,526 A | * | 8/1990 | Pribat et al. |
| 6,015,979 A | | 1/2000 | Sugiura et al. |
| 6,051,849 A | * | 4/2000 | Davis et al. ................. 257/103 |
| 6,111,277 A | | 8/2000 | Ikeda |
| 6,121,121 A | | 9/2000 | Koide |
| 6,153,010 A | | 11/2000 | Kiyoku et al. |
| 6,177,688 B1 | * | 1/2001 | Linthicum et al. ............ 257/77 |
| 6,201,823 B1 | | 3/2001 | Kimura et al. |
| 6,225,650 B1 | | 5/2001 | Tadatomo et al. |
| 6,232,623 B1 | * | 5/2001 | Morita ........................ 257/103 |
| 6,252,261 B1 | | 6/2001 | Usui et al. |
| 6,294,440 B1 | | 9/2001 | Tsuda et al. |
| 6,320,209 B1 | | 11/2001 | Hata et al. |
| 2001/0003019 A1 | * | 6/2001 | Morita |
| 2003/0020087 A1 | * | 1/2003 | Goto et al. .................. 257/103 |

OTHER PUBLICATIONS

US Publication No. 2001/0009167 A1, published Jul. 26, 2001, Davis, et al., "Methods of Fabricating Gallium Nitride Semiconductor Layers by Lateral Overgrowth Through Offset Masks".

* cited by examiner

Primary Examiner—Savitri Mulpuri
(74) Attorney, Agent, or Firm—Sonnenschein, Nath & Rosenthal LLP

(57) ABSTRACT

A base crystal layer is formed on the surface of a basal body by growing, e.g., GaN comprising a III–V compound by MOCVD and then the base crystal layer 12 is etched. An intermediate crystal layer is formed by laterally growing GaN from windows formed in the base crystal layer by etching. In the intermediate crystal layer, an inner layer made of, e.g., AlGaN is formed. Then, the intermediate crystal layer is further etched and a top crystal layer is formed by laterally growing GaN from windows formed in the intermediate crystal layer by etching. An inner layer made of, e.g., AlGaN is formed in the top crystal layer. Development of dislocations is suppressed to some extent by the lateral growth when forming the intermediate crystal layer and the top crystal layer. Further, development of dislocations is suppressed by the inner layers.

4 Claims, 4 Drawing Sheets

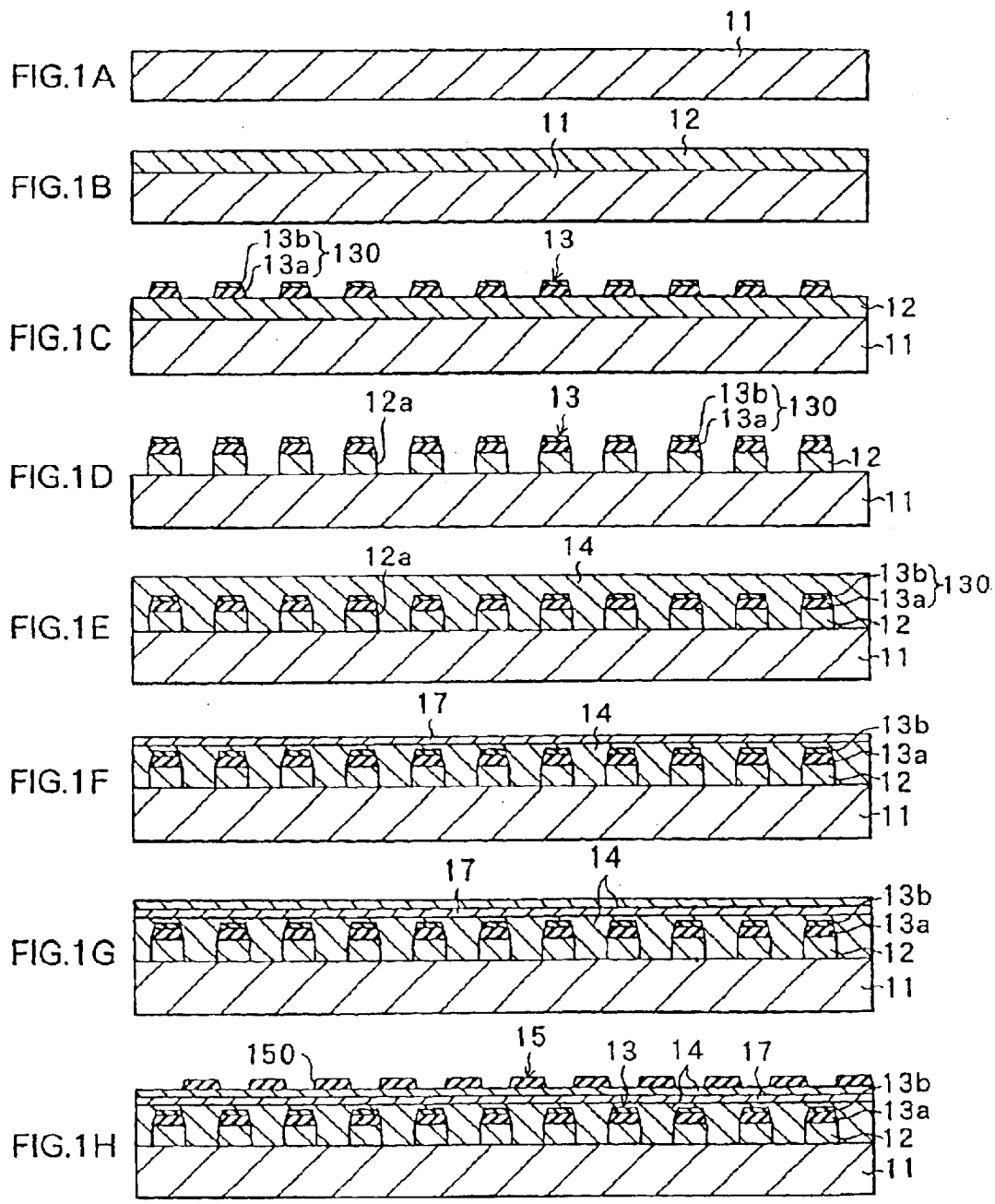

METHOD OF MANUFACTURING CRYSTAL OF III-V COMPOUNDS OF THE NITRIDE SYSTEM, CRYSTAL SUBSTRATE OF III-V COMPOUNDS OF THE NITRIDE SYSTEM, CRYSTAL FILM OF III-V COMPOUNDS OF THE NITRIDE SYSTEM, AND METHOD OF MANUFACTURING DEVICE

RELATED APPLICATION DATA

The present application claims priority to Japanese Application No. P11-357325, filed Dec. 16, 1999, and is a divisional of U.S. application Ser. No. 09/739,491, filed Dec. 18, 2000, now U.S. Pat. No. 6,498,048, all of which are incorporated herein by reference to the extent permitted by law.

BACKGROUND OF THE INVENTION

1. Field of the Invention

The present invention relates to a method of manufacturing a device such as a semiconductor laser device, a crystal substrate of III–V compounds of the nitride system and a crystal film of III–V compounds of the nitride system which are used in the method of manufacturing a device and a method of manufacturing a crystal of III–V compounds of the nitride system.

2. Description of the Related Art

In general, the manufacturing process of a device such as a semiconductor laser device or a light-emitting diode (LED) involves the deposition of semiconductor films or the like laid one upon another over the surface of a crystal substrate or a crystal film comprised of III–V compounds of the nitride system, e.g., gallium nitride (GaN). A desirable method to obtain a crystal substrate or a crystal film for the use in the manufacturing process is to form a bulk of a crystal of III–V compounds of the nitride system, but the manufacture of a bulk of a crystal of III–V compounds of the nitride system is difficult. Thus, it has been the practice to grow epitaxially a crystal of III–V compounds of the nitride system on a basal body made of sapphire ($Al_2O_3$).

However, the difference in the crystal structures of the basal body and the crystal formed thereon, or the small interaction between the basal body and the crystal formed thereon causes dislocations to occur from the interface. Such dislocations develop in the direction of crystal growth, piercing the crystal to reach its surface. This causes a problem that crystal substrates or crystal films thus grown have numerous defects in the surface.

To overcome the problem, Publication of Japanese Unexamined Patent Application No. Hei 10-312971 proposes a method in which a gallium nitride (GaN) base layer is formed over the surface of a sapphire ($Al_2O_3$) basal body, and a mask pattern made of silicon dioxide ($SiO_2$) is formed over the base layer, and then a gallium nitride (GaN) crystal is grown over the base layer with the mask pattern in between. According to the method proposed, the development of dislocations is prevented by the mask pattern, resulting in a reduction in the number of dislocations piercing the crystal to reach its surface. The method, however, cannot sufficiently reduce the number of dislocations in crystal substrates or crystal films because some dislocations develop through windows of the mask pattern to pierce the crystal.

According to Extended Abstracts (The 46th Spring Meeting, (1999); The Japan Society of Applied Physics and Related Societies, page 416, disclosed is a method such that a recessed region is formed on the surface of an base layer made of GaN or the like formed on a basal body made of $Al_2O_3$ and GaN crystals are re-grown on the surface of the base layer. Since the method causes a change in the direction of the development of dislocations at the recessed region of the base layer, the number of dislocations piercing the crystal reduces to some extent. In the method, however, dislocations propagate through the portion other than the recessed region of the base layer. Thus, the method has a problem that the number of dislocations piercing the crystal cannot be reduced sufficiently.

On the other hand, according to MRS Internet J. Nitride Semicond. Res. 4S1, G3.38 (1999) and MRS Internet J. Nitride Semicond. Res. 4S1, G4.9 (1999), proposed are methods of preventing dislocations piercing the crystal using lateral growth. In the former method, a groove is formed in a gallium nitride (GaN) crystal as a seed crystal, and the crystal growth is re-started in the lateral direction from the walls of the groove. In the latter method, after a mask pattern is formed on the surface of a gallium nitride (GaN) crystal as a seed crystal, the gallium nitride (GaN) crystal is etched to form a groove, and the crystal growth is re-started in the lateral direction from the walls of the groove, while the mask pattern prevents the crystal growth over the surface of the seed crystal. However, with the former method, there is a possibility that dislocations will develop from the surface of the seed crystal. With the latter method, there is a possibility that other dislocations will develop above the mask pattern. Thus, both methods have a problem that defects in the surface of the crystal cannot be prevented sufficiently.

SUMMARY OF THE INVENTION

The present invention has been achieved in view of the above problems. It is an object of the invention to provide a crystal substrate of III–V compounds of the nitride system and a crystal film of III–V compounds of the nitride system, a method of manufacturing a crystal of III–V compounds of the nitride system used in the manufacture of the crystal substrate of III–V compounds of the nitride system and the crystal film of III–V compounds of the nitride system, and a method of manufacturing a device employing the method of manufacturing a crystal of III–V compounds of the nitride system.

The method of manufacturing a crystal of III–V compounds of the nitride system of the present invention comprises a step of forming a crystal layer made of III–V compounds of the nitride system on a surface of a basal body, and the crystal layer is provided with at least one inner layer made of III–V compounds of the nitride system having different composition from the composition of the crystal layer.

According to the method of manufacturing a device of the invention, a devise is manufactured by forming a device film on a surface of a crystal substrate or a crystal film. This method includes a step of growing a crystal layer made of III–V compounds of the nitride system on a surface of a basal body, and the crystal layer is provided with at least one inner layer made of III–V compounds of the nitride system having different composition from the composition of the crystal layer.

The crystal substrate of III–V compounds of the nitride system of the present invention comprises a crystal layer made of III–V compounds of the nitride system on a surface of a basal body, and the crystal layer is provided with an inner layer made of III–V compounds having different composition from the composition of the crystal layer.

According to a crystal film of III–V compounds of the nitride system of the present invention, a crystal layer made of III–V compounds of the nitride system is formed on a surface of a basal body, and the crystal layer is provided with an inner layer made of III–V compounds having different composition from the composition of the crystal layer.

According to the method of manufacturing a crystal of III–V compounds of the nitride system, the method of manufacturing a device, the crystal substrate and the crystal film of the present invention, an inner layer having different composition is formed in the crystal layer. Thus, propagation of dislocation bends by the inner layer, and the number of dislocation which propagates crystals is greatly reduced due to the interference between dislocation. Further, the inner layer is made of III–V compounds, so that further propagation of dislocations does not occur at the interface between the inner layer and the crystal layer.

Other and further objects, features and advantages of the invention will appear more fully from the following description.

BRIEF DESCRIPTION OF THE DRAWINGS

FIGS. 1A to 1H are cross sections of each step showing a method of manufacturing a crystal of III–V compounds of the nitride system according to an embodiment of the present intervention;

DETAILED DESCRIPTION OF THE PREFERRED EMBODIMENTS

Figure 2A:
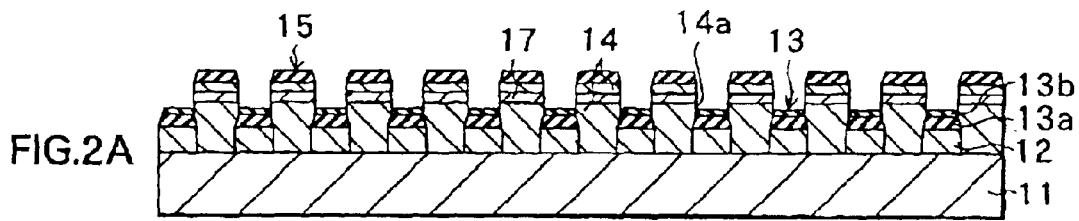
FIGS. 2A to 2E are cross sections showing steps following the steps of FIGS. 1A to 1H.

An embodiment of the present invention will be described in detail below with reference to the accompanying drawings.

FIGS. 1A to 1H and FIGS. 2A to 2E are cross sections showing each step of a method of manufacturing a crystal of III–V compounds of the nitride system according to an embodiment of the present invention. The method of manufacturing a crystal is a method for manufacturing a crystal substrate of III–V compounds of the nitride system used for formation of, e.g., semiconductor laser devices or light-emitting diode (LED), for example. As the III–V compound of the nitride system, crystals of gallium nitride (GaN) are formed herein.

As shown in FIG. 1A, a basal body 11 made of, e.g., sapphire ($Al_2O_3$) is used. As materials for the basal body 11, silicon (Si), silicon carbide (SiC), gallium arsenide (GaAs), magnesium aluminum composite oxide ($MgAl_2O_4$), lithium gallium composite oxide ($LiGaO_2$) or GaN may be used instead of $Al_2O_3$.

As shown in FIG. 1B, a GaN crystal is grown on the surface of the basal body 11 by, e.g., metal organic chemical vapor deposition (MOCVD), molecular beam epitaxy (MBE) or other vapor deposition, thereby forming a base crystal layer 12 with a thickness of, e.g., 2 $\mu$m.

As shown in FIG. 1C, over the surface of the base crystal layer 12, a silicon nitride ($Si_3N_4$) layer and a silicon dioxide ($SiO_2$) layer are deposited in the order named by, for example, sputtering. Then, the laminated layers are patterned using, for example, photolithography and dry etching. Thereby, a first mask pattern 13 including an under layer 13a made of $Si_3N_4$ and an upper layer 13b made of $SiO_2$ is formed. The first mask pattern 13 has a number of parallel stripes 130 arranged at, for example, 4 $\mu$m intervals. Each stripe 130 has a width of, for example, 5 $\mu$m. In this case, the pitch of the stripes 130, i.e., the sum of the width and interval of the stripes, is 9 $\mu$m. The thickness of the stripes 130 of the first mask pattern 13 is, for example, 0.2 $\mu$m.

Next, as shown in FIG. 1D, portions of the base crystal layer 12 which are not covered with the first mask pattern 13 are selectively removed by, for example, dry etching using the first mask pattern 13 as a mask. The deepness of grooves formed by etching is selected so that the base crystal layer 12 is removed enough to expose the basal body 11. Thereby, windows 12a are formed in the base crystal layer 12 by this etching. For example, reactive ion etching (RIE) is preferable for dry etching.

As shown in FIG. 1E, a GaN crystal layer is grown from the windows 12a of the base crystal layer 12 using, e.g., a MOCVD, thereby forming an intermediate crystal layer 14 which covers the base crystal layer 12. At this time, the growth of the GaN crystal takes place laterally from walls of the window 12a (in a direction largely parallel to the surface of the basal body 11). The intermediate crystal layer 14 is grown so as to fully cover the first mask pattern 13 which is formed on the base crystal layer 12.

As shown in FIG. 1F, the III–V compounds of the nitride system having different composition from that of the intermediate crystal layer 14 such as a AlGaN crystal are grown on the intermediate crystal layer 14, thereby forming an inner layer 17. The formation of the inner layer 17 is performed by MOCVD, for example. Then, GaN is further grown with, e.g., MOCVD. Therefore, obtained is a structure such that the inner layer 17 is interposed in the intermediate crystal layer 14, as shown in FIG. 1G. The intermediate crystal layer 14 is 8 $\mu$m in thickness and the inner layer 17 is 0.5 $\mu$m in thickness, for example. Here, the intermediate crystal layer 14 (the part below the inner layer 17 in the intermediate crystal layer 14), the inner layer 17, and the intermediate crystal layer 14 (the part above the inner layer 17 in the intermediate crystal layer 14) are sequentially formed.

Thereafter, as shown in FIG. 1H, a film made of silicon dioxide ($SiO_2$) is deposited over the surface of the intermediate crystal layer 14 using, for example, sputtering. The layer is then patterned using, for example, photolithography and dry etching, and thereby a second mask pattern 15 is formed. The second mask pattern 15 is comprised of a number of stripes 150 arranged at, for example, 4 $\mu$m intervals. Each stripe 150 has a width of, for example, 5 $\mu$m. The pitch of the stripes 150 is 9 $\mu$m. In other words, the second mask pattern 15 is formed in the same pattern arrangement as the first mask pattern 13.

The second mask pattern 15 is aligned with respect to the first mask pattern 13 in the following manner. The stripes 150 of the second mask pattern 15 overlie the windows (regions between the neighboring stripes 130) of the first mask pattern 13 in the direction of the thickness and the windows (regions between the neighboring stripes 150) of the second mask pattern 15 overlie the stripes 130 of the first mask pattern 13 in the direction of the thickness.

Next, as shown in FIG. 2A, portions of the intermediate crystal layer 14 which are not covered with the second mask pattern 15 are selectively removed using dry etching by, for example, RIE using the second mask pattern 15 as a mask. The windows 14a are formed in the intermediate crystal layer 14 by this etching. The stripes 13b of the first mask pattern 13 formed on the base crystal layer 12 serve as an etching stopper, and therefore, the base crystal layer 12 is not removed by etching at this time.

Figure 2B:
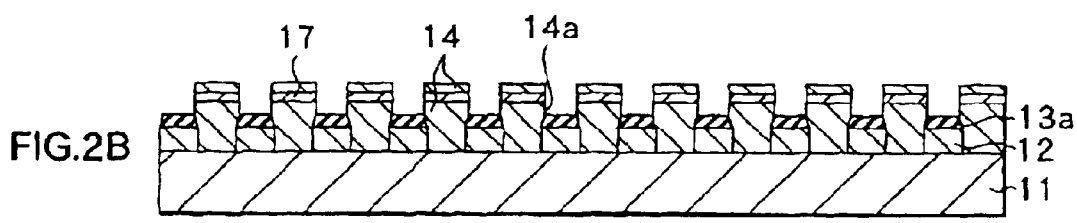

As shown in FIG. 2B, the second mask pattern 15 (FIG. 2A) made of SiO$_2$ is removed using, e.g., hydrogen fluoride water. At this time, the upper layer 13b, made of SiO$_2$, of the first mask pattern 13 is removed, but the lower layer 13a made of SiO$_3$N$_4$ remains.

Figure 2C:
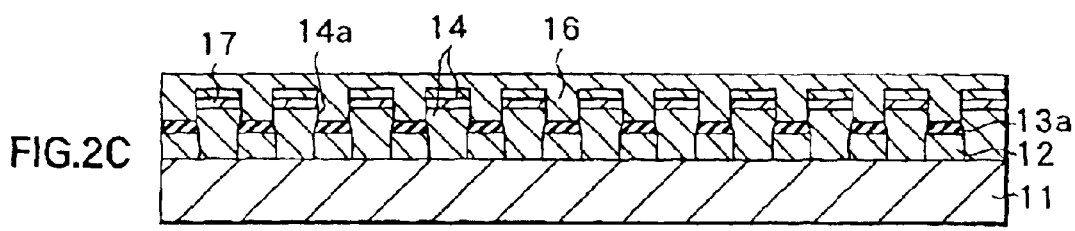

Subsequently, as shown in FIG. 2C, a GaN crystal layer is further grown on the intermediate crystal layer 14 by, e.g., MOCVD, whereby a top crystal layer 16 is formed. At this time, growth of GaN crystals takes place from walls of the window 14a of the intermediate crystal layer 14 and from the surface of the top crystal layer 16 from which the second mask pattern 15 has been removed.

Figure 2D:
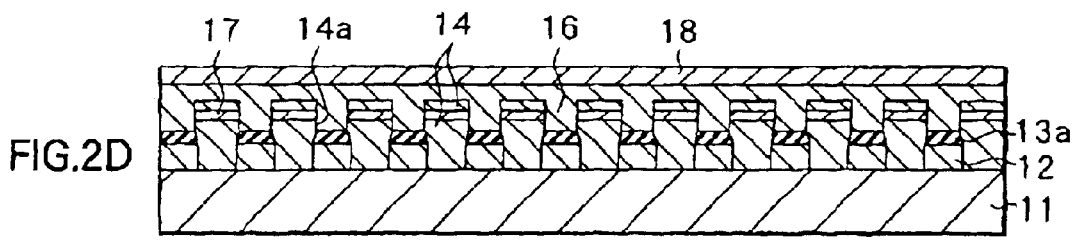

As shown in FIG. 2D, crystals of III–V compounds of the nitride system (e.g., AlGaN) having different composition from that of the top crystal layer 16 is grown on the surface of the top crystal layer 16, thereby forming an inner 18. Therefore, GaN is formed on the inner layer 18. Thus, obtained is a structure such that the inner layer 18 is interposed in the top crystal layer 16. The top crystal layer 16 is 8 μm in thickness and the inner layer 18 is 0.5 μm in thickness, for example.

Figure 2E:
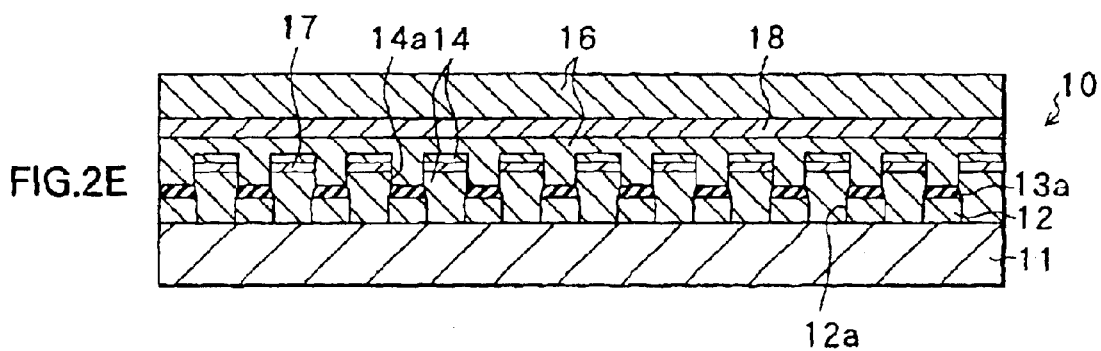

As shown in FIG. 2E, in the above described manner formed is a crystal substrate 10 including the base crystal layer 12, the lower layer 13a of the first mask pattern 13, the intermediate crystal layer 14 and the top crystal layer 16. A device film constituting a semiconductor laser device to be described later is formed on the surface of the crystal substrate 10. A crystal film is applicable to the crystal substrate 10.

Here, the crystal substrate 10 corresponds to a specific example of "crystal substrate" or "crystal film" of the present invention. Each of the base crystal layer 12, the intermediate crystal layer 14 and the top crystal layer 16 corresponds to a specific example of "crystal layer" of the present invention. The base crystal layer 12, the intermediate crystal layer 14, and the top crystal layer 16 correspond to specific examples of "first growth layer", "second growth layer" and "third growth layer" of the present invention, respectively. The first mask pattern 13 and the second mask pattern 15 are specific examples of "first mask pattern" and "second mask pattern" of the present invention, respectively. The window 12a corresponds to a specific example of "first window" of the present invention. The window 14a corresponds to a specific example of "second window or groove" of the present invention.

Figure 3:
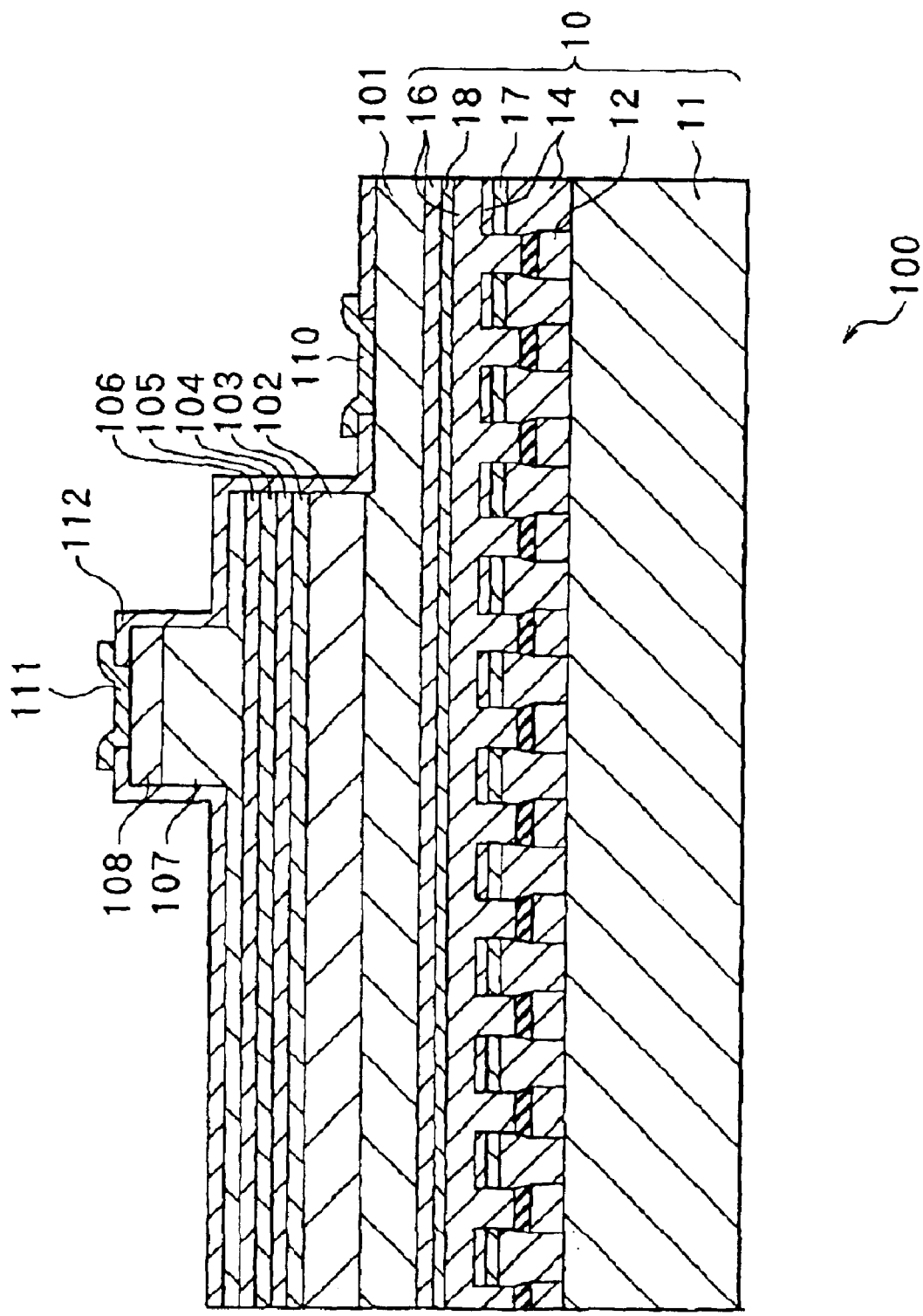
FIG. 3 is a cross section of the structure of a semiconductor laser device employing the crystal substrate manufactured using the method of manufacturing a crystal shown in FIGS. 1A to 2E.

FIG. 3 is a cross section of a semiconductor laser device 100 formed employing the crystal substrate 10. The semiconductor laser device 100 is formed in the following manner. An n-type contact layer 101 made of n-type GaN is formed by growing a GaN film which is doped with predetermined amount of Si by, e.g., MOCVD on the surface of the crystal substrate 10. A cladding layer 102 made of n-type AlGaN is formed by growing an AlGaN film which is doped with Si on the n-type contact layer 101. An n-guide layer 103 made of n-type GaN is formed on the cladding layer 102 by growing a GaN film, which is doped with predetermined amount of Si. An active layer 104 having a multiple quantum well structure is formed by depositing a GaIn film on the n-guide layer 103.

Subsequently, on the active layer 104 formed is a cap layer 105 made of p-type AlGaN by depositing an AlGaN film, which is doped with predetermined amount of, e.g., magnesium (Mg). Formed on the cap layer 105 is a p-guide layer 106 made of p-type GaN by growing a GaN film which is doped with predetermined amount of, e.g., Mg. A cladding layer 107 made of p-type AlGaN is formed on the p-guide layer 106 by depositing a AlGaN film, which is doped with predetermined amount of, e.g., Mg. A p-type contact layer 108 made of p-type GaN is formed on the cladding layer 107 by depositing a GaN film, which is doped with predetermined amount of, e.g., Mg. The p-type contact layer 108 and the cladding layer 107 are patterned in the form of a stripe by, e.g., dry etching, thus so called laser stripes are formed.

Next, corresponding to a position where an n-electrode 110 will be formed, the cladding layer 102, the n-guide layer 103, the active layer 104, the cap layer 105, the p-guide layer 106 and the cladding layer 107 are removed by photolithography or the like, thereby exposing the n-type contact layer 101. After that, the whole surface of the laminated layers from the n-type contact layer 101 to the p-type contact layer 108 is covered by an insulating film 112, and an n-electrode 110 and a p-electrode 111 are formed. The n-electrode 110 has a structure such that titanium (Ti), aluminum (Al), platinum (Pt) and gold (Au) are laminated and then alloyed by means of heating. The p-electrode 111 has a structure such that nickel (Ni), Pt and Au are laminated and then alloyed by means of heating.

Thus, the semiconductor laser device 100 is obtained as illustrated in FIG. 3. The semiconductor laser device 100 is separated by cutting and packaged in a predetermined package. Thus, a semiconductor light-emitting device is completed. The n-guide layer 103 positioned below the active layer 104 and the p-guide layer 106 positioned above the active layer 104 have a high refractive index than that of the active layer 104, whereby lights are trapped between the guide layers 103 and 106. Here, the semiconductor laser device 100 corresponds to a specific example of "device" of the present invention, and a multi-layer film comprising the layers from the n-type contact layer 101 to the p-type contact layer 108 and the n-electrode 110 and the p-electrode 111 corresponds to a specific example of "device film" of the present invention.

Next, effects of the embodiment will be described below. As shown in FIG. 2E, in the intermediate crystal layer 14 provided is the inner layer 17 having different composition from that of the intermediate crystal layer 14. Hence, even though dislocations extend with the growth of the intermediate crystal layer 14, the dislocations bend by the stress of the inner layer 17. Thus, the dislocations do not pierce the crystal substrate 10. Similarly, in the top crystal layer 16 provided is the inner layer 18 having different composition from that of the top crystal layer 16. Thus, even though dislocations extend with the growth of the top crystal layer 16, the dislocations bend by the stress of the inner layer 18. Therefore, the dislocations do not pierce the crystal substrate 10. Since the inner layer 17 and the inner layer 18 are made of III–V compounds of the nitride system, further propagation of dislocations does not occur at the interface between the inner layer 17 and the intermediate crystal layer 14 and the interface between the inner layer 18 and the top crystal layer 16. As described above, provision of the inner layer 17 in the intermediate crystal layer 14 and the inner layer 18 in the top crystal layer 16 prevents dislocation from reaching the surface of the crystal substrate 10. Thus, a crystal substrate with few defects is obtained.

Further, as illustrated in FIG. 1E, in the step of forming the intermediate crystal layer 14, crystals are grown laterally (largely parallel to the surface of the basal body 11) from walls of the window 12a of the base crystal layer 12. Dislocations occur at the interface between the basal body 11 and the base crystal layer 12 and extend in a direction largely orthogonal to the surface of the basal body 11 as the base crystal layer 12 grows. The middle crystal layer 14 is formed by laterally growing crystals from walls of the window 12a, whereby propagation of dislocations to the intermediate crystal layer 14 is suppressed.

In the step of forming the intermediate crystal layer 14 illustrated in FIG. 1E, there is a possibility that further propagation of dislocations occurs on the stripes 130 of the first mask pattern 13. However, in the step illustrated in FIG. 2A, the area on the stripes 130 in the intermediate crystal layer 14 is removed. Thus, within the intermediate crystal layer 14, the area having a possibility of including dislocations is removed, but the area largely free from dislocations remains, which further prevents dislocations from propagating to the top crystal layer 16. Accordingly, dislocations piercing the crystal to reach the surface of the crystal substrate 10 shown in FIG. 2C are considerably reduced.

In the step illustrated in FIG. 2A, since the growth of the top crystal layer 16 also takes place from the surface of the intermediate crystal layer 14, the top crystal layer 16 is smoothly grown, whereby high-quality crystals are formed. After removing the second mask pattern 15 and the upper layer 13b of the first mask pattern 13, the lower layer 13a of the first mask pattern 13 remains. Hence, dislocations extending vertically to the surface of the basal body 11 is prevented from propagating to the top crystal layer 16 from the surface of the first mask pattern 13.

As described, in the embodiment the intermediate crystal layer 14 is formed by laterally growing crystals from the window 12a of the base crystal layer 12, thereby preventing dislocations from propagating to the intermediate crystal layer 14. The area on the stripes 130 of the first mask pattern 13 (i.e., the area having a possibility of occurrence of dislocations) in the intermediate crystal layer 14 is removed by etching, thereby preventing dislocations from reaching the surface of the crystal substrate 10. Accordingly, a high-quality crystal substrate with few defects can be formed.

The first mask pattern 13 does not need to have a double-layer structure comprising the lower layer 13a made of $Si_3N_4$ and the upper layer 13b made of $SiO_2$. So long as the first mask pattern 13 is not completely removed at the time of removing the second mask pattern 15, other structures are applicable to the first mask pattern. For example, the first mask pattern 13 is constructed as a single layer made of $SiO_2$ having a thickness greater than that of the second mask pattern 15.

Although in the above embodiment, AlGaN is used as the III–V compound of the nitride system constituting the inner layer 17 and the inner layer 18, other III–V compounds of the nitride system such as a compound of the AlGaInN system including GaInN, AlInN may be used.

Further, a $Si_3N_4$ layer may be provided on the upper layer 13b made of $SiO_2$ of the first mask pattern 13. By this arrangement, crystal growth takes place on the $Si_3N_4$ layer in the formation of the intermediate crystal layer 14. Thus, crystallinity of the intermediate crystal layer 14 improves. This is because it is known that preferred crystallinity is obtained when the III–V compounds of the nitride system are grown on the $Si_3N_4$ layer.

The first mask pattern 13 and the second mask pattern 15 are not limited to the stripe arranged in one direction, but may take a two-dimensional configuration such as rhombus, triangle and hexagon. The number of the mask pattern is not limited to two, and three or more of the mask pattern may be provided. The interval between stripes of the first mask pattern 13 and the second mask pattern 15 is not limited to 5 $\mu$m. The width of the stripe is also not limited to 4 $\mu$m. The interval and the width of the stripe may be changed, for example. Moreover, the embodiment is applicable to a case where only one mask pattern is used. The mask pattern may be formed using a self-organization process such as a pin hole of a mask film, for example.

First Modification

Next, a first modification of the embodiment will be described below. With the above-described embodiment, the windows 12a of the base crystal layer 12 and the windows 14a of the intermediate crystal layer 14 do not overlap along the thickness of the layers as illustrated in FIG. 2E. However, in the first modification, windows of the base crystal layer and windows (or grooves) of the intermediate crystal layer overlap with each other in some parts, but does not overlap in some other parts.

Figure 4:
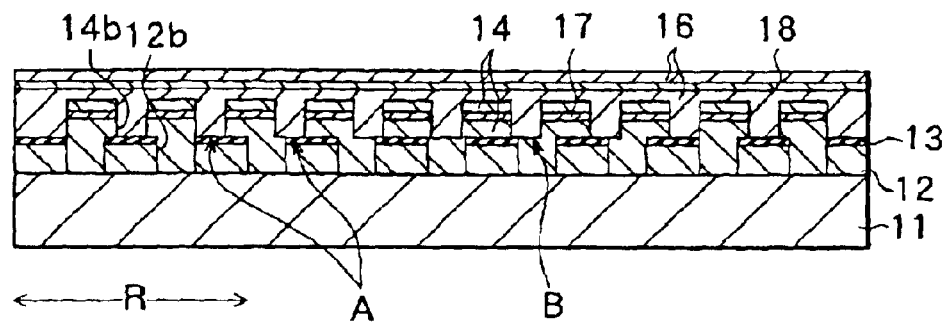
FIG. 4 is a cross section of the structure of a crystal substrate according to a first modification of the embodiment according to the invention.

FIG. 4 is a cross section of the structure of a crystal substrate according to the first modification. In FIG. 4, the same elements as those of the first embodiment are indicated by the same reference numerals. With this modification, the windows 12b of the base crystal layer 12 and the windows 14b (or grooves) of the intermediate crystal layer 14 overlap with each other in some parts, but does not overlap in some other parts. The window 12b corresponds to one specific example of "first window" of the present invention. Among the windows 14b, the window reaching through to the intermediate crystal layer 14 indicated by A corresponds to a specific example of "second window" of the present invention and the window not reaching through to the intermediate crystal layer 14 indicated by B corresponds to a specific example of "groove" of the present invention.

With the first modification, as indicated by R, in a region where the window 12b of the base crystal layer 12 and the window 14b of the intermediate crystal layer 14 does not overlap with each other, propagation of dislocations piercing the crystal is prevented. Therefore, occurrence of dislocation on the surface is suppressed. Hence, the semiconductor laser device illustrated in FIG. 3 can be formed in the region indicated by R.

Second Modification

Figure 5:
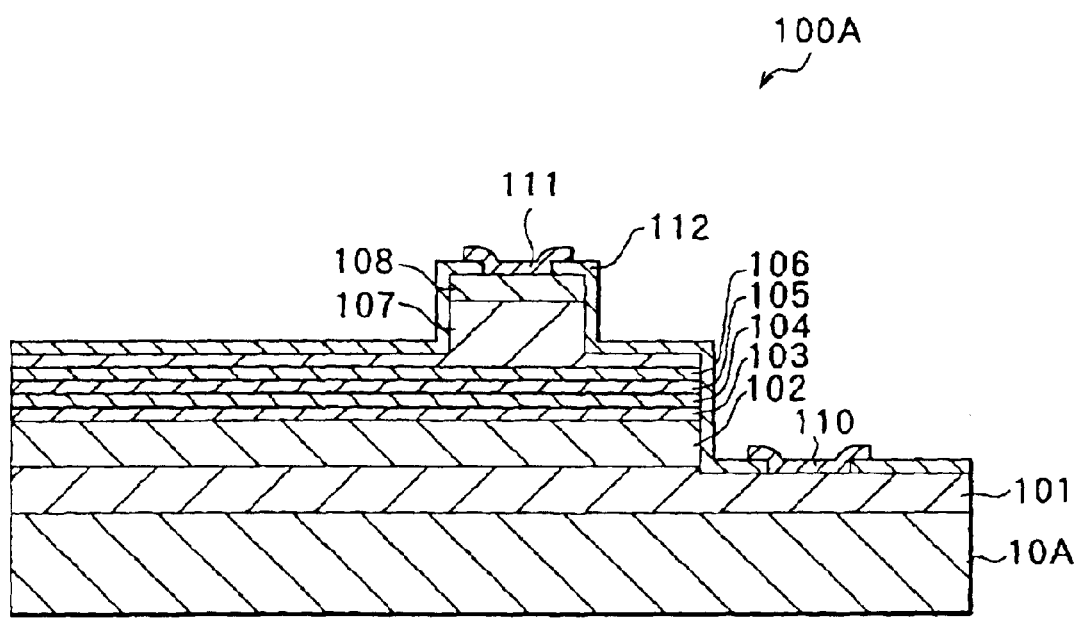
FIG. 5 is a cross section of the structure of a semiconductor laser device of a second modification of the embodiment according to the present invention.

A second modification of the embodiment will be described below. With the first embodiment, as shown in FIG. 2E, the crystal substrate 10 is constituted as the integrated unit comprising the basal body 11, the crystal layers 12, 14 and 16. However, a crystal substrate composed of the top crystal layer 16 or a crystal substrate composed of the top crystal layer 16 and other crystal layers may be obtained by removing several crystal layers including the basal body 1. Examples of the method for removing the basal body 11 or the like are a method using irradiation of laser beams, a method using ultrasound or the like. A semiconductor laser device may be formed using the crystal substrate formed in this manner. FIG. 5 is a cross section showing a semiconductor laser device 100A formed using a crystal substrate 10A comprising only the top crystal layer 16. Each element layer formed on the crystal substrate 10A has the same structure as that of the aforementioned embodiment as in FIG. 3. Further, the semiconductor laser device may have a configuration such that an inductive substrate is formed by doping and an n-electrode is provided on the back surface of the substrate when forming the crystal substrate 10A.

Although the present invention has been described above by exemplifying the embodiment and modifications, the present invention is not limited to the above embodiment and modifications and various other modifications are possible. For example, in the above, the semiconductor laser device is a so called separate confinement heterostructure (SCH) type, but the present invention may be applied to various laser devices such as a gain-waveguide type, refractive index waveguide type or the like. Further, the present invention may be applied to semiconductor devices such as a light-emitting diode, an electric field effect type transistor in addition to the semiconductor laser device.

As described above, according to the method of manufacturing a crystal of III–V compounds of the nitride system, the method of manufacturing a device, the crystal substrate of III–V compounds of the nitride system, and the crystal film of III–V compounds of the nitride system of the present invention, in the crystal layer of III–V compounds of the nitride system, the inner layer having different composition from that of the crystal layer is formed. Therefore, even though dislocations occur in crystals, development of the dislocations is prevented by the inner layer. Thus, a crystal substrate or a crystal film with few defects is easily formed. Further, the inner layer is made of III–V compounds of the nitride system, whereby there is less possibility that further propagation of dislocations occurs at the interface between the inner layer and the crystal layer.

According to the method of manufacturing a crystal of III–V compounds of the nitride system of another aspect of the invention, the first growth layer is etched and then the second growth layer is formed so as to cover the first growth layer, so that crystal growth takes place from the walls or the like of the window formed by, e.g., etching. Thus, growth of dislocations is prevented, for example. Specifically, occurrence of defects in the crystal substrate or the crystal film is suppressed more effectively.

Obviously many modifications and variations of the present invention are possible in the light of the above teachings. It is therefore to be understood that within the scope of the appended claims the invention may be practiced otherwise than as specifically described.

What is claimed is:

1. A crystal substrate of III–V compounds of the nitride system, comprising a crystal layer made of III–V compounds of the nitride system crystal on the surface of a basal body, wherein:
    (1) inner layer provided in the crystal layer, the inner layer being made of III–V compounds having composition different than the composition of the crystal layer, and
    (2) the crystal layer includes
        (a) a first growth layer on the surface of the basal body, the first growth layer having first windows,
        (b) a second growth layer covering the first growth layer, the second growth layer having second windows or grooves, and
        (c) a third growth layer covering the second growth layer, the third growth layer having the same composition as that of the second growth layer.

2. A crystal substrate of III–V compounds of the nitride system according to claim 1, wherein the crystal layer is GaN.

3. A crystal substrate of III–V compounds of the nitride system according to claim 1, wherein the inner layer is AlGaN.

4. A crystal substrate of III–V compounds of the nitride system according to claim 1, wherein the first and the second mask patterns are deposited in a unidirectional stripe pattern.

* * * * *